United States Patent
Wilk

(10) Patent No.: US 7,799,680 B2
(45) Date of Patent: Sep. 21, 2010

(54) SURFACE PREPARATION PRIOR TO DEPOSITION ON GERMANIUM

(75) Inventor: Glen Wilk, Scottsdale, AZ (US)

(73) Assignee: ASM America, Inc., Pheonix, AZ (US)

( * ) Notice: Subject to any disclaimer, the term of this patent is extended or adjusted under 35 U.S.C. 154(b) by 669 days.

(21) Appl. No.: 11/651,324

(22) Filed: Jan. 9, 2007

(65) Prior Publication Data

US 2007/0111521 A1    May 17, 2007

Related U.S. Application Data

(62) Division of application No. 10/910,551, filed on Aug. 3, 2004, now Pat. No. 7,202,166.

(60) Provisional application No. 60/492,408, filed on Aug. 4, 2003.

(51) Int. Cl.
H01L 21/44 (2006.01)

(52) U.S. Cl. .......... 438/680; 257/E21.29; 257/E21.207; 257/E21.28; 257/E21.274; 257/E21.297

(58) Field of Classification Search .......... 257/E21.29, 257/E21.192, E21.207, E21.28, E21.274, 257/E21.297, E21.279, E21.01; 438/680

See application file for complete search history.

(56) References Cited

U.S. PATENT DOCUMENTS

| | | | |
|---|---|---|---|
| 4,828,224 A | 5/1989 | Crabb | |
| 5,221,556 A | 6/1993 | Hawkins | |
| 5,382,333 A | 1/1995 | Ando et al. | |
| 5,939,334 A | 8/1999 | Nguyen et al. | |
| 6,033,584 A | 3/2000 | Ngo et al. | |
| 6,093,252 A | 7/2000 | Wengert | |
| 6,124,189 A | 9/2000 | Watanabe et al. | |
| 6,130,123 A | 10/2000 | Liang et al. | |
| 6,420,279 B1 | 7/2002 | Ono et al. | |
| 6,444,592 B1 * | 9/2002 | Ballantine et al. | ........... 438/770 |
| 6,455,445 B2 | 9/2002 | Matsuki | |
| 6,482,262 B1 | 11/2002 | Elers et al. | |

(Continued)

FOREIGN PATENT DOCUMENTS

EP    0 469 470 A1    7/1991

(Continued)

OTHER PUBLICATIONS

Hoyas et al., "Growth and Characterization of Atomic Layer Deposited WCO.7NO.3 on Polymer Films," *Journal of Applied Physics*, vol. 95, No. 1, (Jan. 1, 2004).

(Continued)

*Primary Examiner*—Matthew C Landau
*Assistant Examiner*—Jessica Hall
(74) *Attorney, Agent, or Firm*—Knobbe, Martens, Olson & Bear LLP

(57) ABSTRACT

Methods are provided for treating germanium surfaces in preparation for subsequent deposition, particularly gate dielectric deposition by atomic layer deposition (ALD). Prior to depositing, the germanium surface is treated with plasma products or thermally reacted with vapor reactants. Examples of surface treatments leave oxygen bridges, nitrogen bridges, —OH, —NH and/or —$NH_2$ terminations that more readily adsorb ALD reactants. The surface treatments avoid deep penetration of the reactants into the germanium bulk but improve nucleation.

18 Claims, 4 Drawing Sheets

U.S. PATENT DOCUMENTS

| | | | |
|---|---|---|---|
| 6,482,733 | B2 | 11/2002 | Raaijmakers et al. |
| 6,482,740 | B2 | 11/2002 | Soininen et al. |
| 6,511,539 | B1 | 1/2003 | Raaijmakers |
| 6,537,370 | B1 | 3/2003 | Hernandez et al. |
| 6,599,572 | B2 | 7/2003 | Saanila et al. |
| 6,599,781 | B1 * | 7/2003 | Li ............................ 438/142 |
| 6,613,695 | B2 | 9/2003 | Pomarede et al. |
| 6,686,271 | B2 | 2/2004 | Raaijmakers et al. |
| 6,727,169 | B1 | 4/2004 | Raaijmakers et al. |
| 6,753,249 | B1 | 6/2004 | Chen et al. |
| 6,759,325 | B2 | 7/2004 | Raaijmakers et al. |
| 6,794,287 | B2 | 9/2004 | Saanila |
| 6,800,552 | B2 | 10/2004 | Elers et al. |
| 6,875,279 | B2 | 4/2005 | Chu et al. |
| 6,878,628 | B2 | 4/2005 | Sophie et al. |
| 6,933,225 | B2 | 8/2005 | Werkhoven et al. |
| 6,949,456 | B2 | 9/2005 | Kumar |
| 6,955,986 | B2 | 10/2005 | Li |
| 6,986,914 | B2 | 1/2006 | Elers et al. |
| 6,995,430 | B2 * | 2/2006 | Langdo et al. ............. 257/352 |
| 7,056,835 | B2 | 6/2006 | Pomarede et al. |
| 7,211,508 | B2 | 5/2007 | Chung et al. |
| 7,306,956 | B2 | 12/2007 | Kuse |
| 2002/0027286 | A1 | 3/2002 | Sundararajan et al. |
| 2002/0098627 | A1 * | 7/2002 | Pomarede et al. ........... 438/149 |
| 2002/0098685 | A1 | 7/2002 | Sophie et al. |
| 2003/0064607 | A1 | 4/2003 | Leu et al. |
| 2003/0082296 | A1 | 5/2003 | Elers et al. |
| 2003/0082300 | A1 | 5/2003 | Todd et al. |
| 2003/0124818 | A1 | 7/2003 | Luo et al. |
| 2003/0157787 | A1 | 8/2003 | Murthy et al. |
| 2003/0165615 | A1 | 9/2003 | Aaltonen et al. |
| 2003/0207127 | A1 | 11/2003 | Murthy et al. |
| 2003/0232510 | A1 | 12/2003 | Buchanan |
| 2003/0235931 | A1 | 12/2003 | Wada et al. |
| 2004/0071878 | A1 | 4/2004 | Schumacher et al. |
| 2004/0114398 | A1 | 6/2004 | Lipcsei et al. |
| 2004/0121616 | A1 | 6/2004 | Satta et al. |
| 2004/0175928 | A1 | 9/2004 | Abell |
| 2004/0214399 | A1 * | 10/2004 | Ahn et al. ................... 438/287 |
| 2004/0219735 | A1 | 11/2004 | Brabant |
| 2005/0048797 | A1 | 3/2005 | Fukazawa |
| 2005/0079692 | A1 | 4/2005 | Samoilov et al. |
| 2005/0106893 | A1 | 5/2005 | Wilk |
| 2005/0179135 | A1 | 8/2005 | Kumar |
| 2005/0181555 | A1 | 8/2005 | Haukka et al. |
| 2005/0186342 | A1 | 8/2005 | Sager et al. |
| 2005/0212139 | A1 | 9/2005 | Leinikka et al. |
| 2006/0078679 | A1 | 4/2006 | Elers et al. |
| 2006/0216932 | A1 | 9/2006 | Kumar et al. |
| 2006/0292872 | A1 | 12/2006 | Hauuka et al. |
| 2007/0170541 | A1 | 7/2007 | Chui et al. |

FOREIGN PATENT DOCUMENTS

| | | |
|---|---|---|
| EP | 0858101 | 2/1998 |
| JP | 8264530 | 10/1996 |
| WO | WO 93/10652 | 5/1993 |
| WO | WO 96/17107 | 6/1996 |
| WO | WO 00/01006 | 1/2000 |
| WO | WO 00/15885 | 3/2000 |
| WO | WO 00/47404 | 8/2000 |
| WO | WO 00/47796 | 8/2000 |
| WO | WO 00/54320 | 9/2000 |
| WO | WO 01/27347 | 4/2001 |
| WO | WO 01/29280 A1 | 4/2001 |
| WO | WO 01/29893 | 4/2001 |
| WO | WO 01/66832 | 9/2001 |
| WO | WO 01/88972 A1 | 11/2001 |
| WO | WO 2004/064147 | 7/2004 |
| WO | WO 2004/114393 A | 12/2004 |

OTHER PUBLICATIONS

Jehn et al. "Gmelin Handbook of Inorganic and Organometallic Chemistry," 8th ed. vol. A5b, 131-154, Springer-Verlag, Berlin (1993).

Kirk-Othmer, "Encyclopedia of Chemical Technology," $4^{th}$ ed., Vo. 4, 841-878, A Wiley Interscience Publication, John Wiley & Sons, New York (1992).

Klaus et al., "Atomic layer deposition of tungsten using sequential surface chemistry with a sacrificial stripping reaction," *Thin Solid Films* 360, 145-153 (2000).

Koh et al. "Meeting the Cu diffusion barrier challenge using ALD tungsten nitride carbide," *Solid State Technology*, 54-58 (Jun. 2005).

Lai et al., "Precursors for Organometallic Chemical Vapor Deposition of Tungsten Carbide Films," *Chem. Mater*, 7, 2284-2292 (1995).

Nakajima et al. "Chemical Vapor Deposition of Tungsten Carbide, Molybdenum Carbide Nitride, and Molybdenum Nitride Films," *J. Electrochem. Soc.*, vol. 144, No. 6 (Jun. 1997).

Onda et al. "Hydrogen Plasma Cleaning a Novel Process for IC-Packaging," semiconductorfabtech.com (Jan. 2, 2002).

Peters, Laura, "Pursuing the Perfect Low-k Dielectric," *Semiconductor International* 21:10 (1998).

Ryan et al. "Material property characterization and integration issues for mesoporous silica," *Proceedings of the IEEE 1999 International Interconnect Technology Conference* 187-189 (1999).

Schumacher et al., "Integration of ALD WCN Into a Dual Damascene Oxide Module."

"Ullmann's Encyclopedia of Industrial Chemistry," $5^{th}$ ed., vol. A5, 62-154 (1986).

Utriainen et al., Studies of metallic thin film growth in an atomic layer epitaxy reactor using $M(acac)_2$(M=Ni, Cu, Pt) precursors, *Applied Surface Science*, 157, 151-158 (2000).

Wolf et al. "Process and equipment simulation of copper chemical vapor deposition using Cu(HFAC)VTMS," *Microelectronic Engineering*, 45(1):15-27 (Feb. 1999).

Bai et al., "Ge MOS Characteristics with CVD HfO2 Gate Dielectrics and TaN Gate Electrode", VLSI Technology Digest of Technical Papers 121-122 (2003).

Cannon, D. et al., "Tensile strained epitaxial Ge films on Si(100) substrates with potential application in L-band telecommunications," Applied Physics Letter, vol. 84, No. 6, Feb. 9, 2004, pp. 906-908.

Colace, L. et al., "Efficient high-speed near-infrared Ge photodetectors integrated on Si substrates," Applied Physics Letters, vol. 76, No. 10, Mar. 6, 2000, pp. 1231-1233.

Colace, L. et al., "Ge-on-Si Approaches to the Detection of Near-Infrared Light," IEEE Journal of Quantum Electronics, vol. 35, No. 12, Dec. 1999, pp. 1843-1852.

Fama, S. et al., "High performance germanium-on silicon detectors for optical communications," Applied Physics Letters, vol. 81, No. 4, Jul. 22, 2002, pp. 586-588.

Hull, R., "Metastable strained layer configurations in the SiGe/Si System," (1999) *EMIS Datareviews, Series No. 24 of SiGe and SiGe:C*, edited by Erich Kasper et al., INSPEC (2000), London, UK.

Ishikawa, Y. et al., "Strain-induced band gap shrinkage in Ge grown on Si substrate," Applied Physics Letters, vol. 82, No. 12, Mar. 31, 2003, pp. 2044-2046.

Lee et al., "Growth of strained Si and strained Ge heterostructures on relaxed $Si_{1-x}$ $G_{ax}$Gaby ultrahigh vacuum chemical vapor deposition," J. Vac. Sci. Technol. B 22(1) (Jan./Feb. 2004).

Li, Q, et al., "Selective growth of Ge on Si(100) through vias of SiO2 nanotemplate using solid source molecular beam epitaxy," Applied Physics Letters, vol. 83, No. 24, Dec. 15, 2003, pp. 5032-5034.

Liu, J. et al., "Silicidation—induced band gap shrinkage In Ge epitaxial films on Si," Applied Physics Letters, vol. 84, No. 5, Feb. 2, 2004, pp. 660-662.

Masini, G. et al., "High-Performance p-i-n Ge on Si Photodetectors for the Near Infrared: From Model to Demonstration," IEEE Transactions of Electron Devices, vol. 48, No. 6, Jun. 2001, pp. 1092-1096.

Schollhorn et al., "Coalescence of geranium islands on silicon," Thin Solid Films, vol. 336 (1988), pp. 109-111.

Samavedam, B. et al. "High-Quality Germanium Photodiodes on Silicon Substrates Using an Intermediate Chemical Mechanical Polishing Step".

* cited by examiner

SURFACE PREPARATION PRIOR TO DEPOSITION ON GERMANIUM

PRIORITY APPLICATION

This application is a divisional of U.S. patent application Ser. No. 10/910,551 (filed 3 Aug. 2004 now U.S. Pat. No. 7,202,166), which claims the benefit of U.S. Provisional Patent Application 60/492,408 (filed 4 Aug. 2003). The entire disclosure of both of these priority applications is hereby incorporated by reference herein.

FIELD OF THE INVENTION

The invention relates generally to surface preparation prior to film deposition for semiconductor fabrication, and more particularly to germanium surface preparation to facilitate nucleation in subsequent vapor deposition processes.

BACKGROUND OF THE INVENTION

Integrated circuit design is constantly being scaled down in pursuit of faster circuit operation and lower power consumption. Scaled dimensions in a circuit design generally requires attendant changes in fabrication processing.

A basic building block of integrated circuits is the thin film transistor (TFT). As is known in the art, the transistor typically includes a gate electrode separated from a semiconductor layer or substrate by a thin gate dielectric material. One area in which process control is particularly critical is the fabrication of transistor gate dielectrics. In the pursuit of ever faster and more efficient circuits, semiconductor designs are continually scaled down with each product generation. Transistor switching time plays a large role in the pursuit of faster circuit operation. Switching time, in turn, can be reduced by reducing the channel length of the transistors. In order to realize maximum improvements in transistor performance, vertical dimensions should be scaled along with horizontal dimensions. Accordingly, effective gate dielectric thickness, junction depth, etc. will all decrease with future generation integrated circuits.

Conventional gate dielectrics are formed of high quality silicon dioxide and are typically referred to as "gate oxide" layers. Ultra thin gate oxides (for example, less than 5 nm), however, have been found to exhibit high defect densities, including pinholes, charge trapping states, and susceptibility to hot carrier injection effects. Such high defect densities lead to leakage currents through the gate dielectric and rapid device breakdown unacceptable for circuit designs with less than 0.25 μm gate spacing, that is, sub-quarter-micron technology. Even if the integrity of the oxide is perfectly maintained, quantum-mechanical effects set fundamental limits on the scaling of gate oxide due to quantum tunneling effects.

Theoretically, incorporating materials of higher dielectric constant into the gate dielectric opens the door to further device scaling. Due to higher dielectric constant, many materials can exhibit the same capacitance as a thinner silicon dioxide layer, such that a lower equivalent oxide thickness (EOT) can be achieved without tunnel-limited behavior. Silicon nitride ($Si_3N_4$), for example, has a higher dielectric constant ("k value") than $SiO_2$ and also demonstrates good diffusion barrier properties, resisting boron penetration. More exotic "high k" materials with even higher dielectric constants, including aluminum oxide ($Al_2O_3$), zirconium oxide ($ZrO_2$), hafnium oxide ($HfO_2$), barium strontium titanate (BST), strontium bismuth tantalate (SBT), tantalum oxide ($Ta_2O_5$), and the like, are also being investigated to allow further device scaling.

Recent developments on another front in transistor design have focused on increasing the electrical carrier mobility in the single-crystal semiconductor material (substrate or epitaxial layer) in which the transistors are formed. One method of increasing carrier mobility is to produce strained layers, such as strained silicon over relaxed silicon germanium.

Pure germanium also exhibits greater carrier mobility than silicon, whether or not the germanium crystal structure is strained. Until recently, interest in germanium has been limited, in part, by the inability to grow consistent, high quality oxides from the surface, such that gate dielectrics would have to be deposited. Since oxides thermally or chemically grown from silicon exhibited the highest quality and most consistent thickness, a preference for silicon dioxide gate dielectrics has until recently dictated a preference for silicon over germanium as the semiconductor material of choice.

The growing preference for deposited high k dielectrics, rather than grown oxides, now has the potential to obviate the most significant disadvantage to germanium as the semiconductor base layer for transistor. The possibility for high carrier mobility in germanium combined with scaled dimensions enabled by high k dielectrics is very attractive for future integrated circuit design.

Despite significant advantages for these materials, both germanium and high k materials raise their own integration challenges. Accordingly, significant advances are required before production worthy methods are available for integrating these new materials into fabrication process flows.

SUMMARY OF THE INVENTION

Uniformity in dielectric thickness is particularly important for device consistency. Whereas silicon dioxide could be easily chemically or thermally grown from silicon at a uniform thickness, deposition techniques tend not to produce such uniformity.

One method of reliable, almost perfectly conformal deposition of extremely thin layers is atomic layer deposition (ALD). This cyclical deposition technique has the advantage of self-limiting surface reactions, such that thickness uniformity does not depend upon uniform substrate temperatures (in contrast to CVD in the kinetic regime) nor upon uniform reactant supplies (in contrast to PVD and to CVD in the mass transport regime).

Despite these advantages, the inventor has recognized limitations upon the uniformity offered by ALD. In particular, ALD is prone to nucleation effects, depending upon the reactants and surfaces upon which deposition is to start. At the thickness ranges envisioned for high k gate dielectrics, thickness non-uniformities due to inconsistent nucleation can critically affect device performance. Furthermore, the inventor has recognized that germanium surfaces are especially subject to poor nucleation of typical ALD reactions.

Accordingly, a need exists for improving the speed, efficiency, quality and uniformity of depositing layers upon germanium surfaces. In satisfaction of this need, methods are provided herein for treating germanium surfaces in preparation for subsequent deposition.

In accordance with one aspect of the invention, a germanium surface is treated with plasma products prior to deposition thereover. In accordance with another aspect of the invention, a germanium surface is thermally reacted with vapor phase reactants prior to deposition thereover. Exemplary surface treatments include provision of oxygen- and/or nitrogen-containing vapor reactants, activated thermally or through a remote plasma module attached to a deposition chamber, for in situ surface treatment prior to deposition.

Preferred embodiments leave one or a mixture of oxygen bridges, nitrogen bridges, —OH, —NH and —NH$_2$ surface groups at the germanium surface prior to atomic layer deposition of a high k dielectric. Advantageously, ALD reactants more readily adsorb upon the treated surface. By changing the surface termination of the substrate with a low temperature surface treatment, subsequent deposition is advantageously facilitated without significantly affecting the bulk properties of the underlying material.

BRIEF DESCRIPTION OF THE DRAWINGS

These and other aspects of the invention will be readily apparent from the following description and from the appended drawings, which are meant to illustrate and not to limit the invention, and wherein.

DETAILED DESCRIPTION OF THE PREFERRED EMBODIMENT

Figure 1:
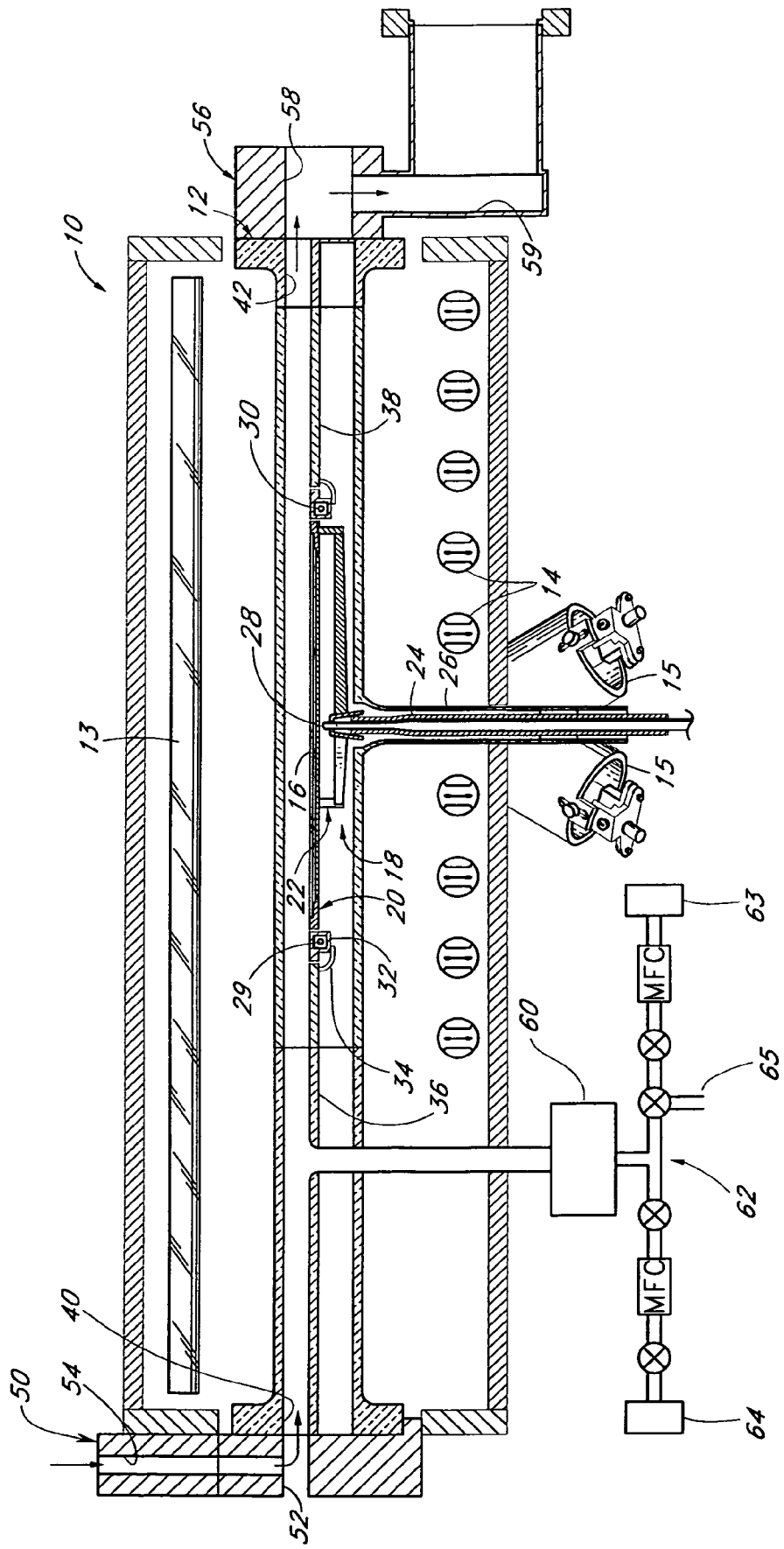
FIG. 1 is a schematic sectional view of an exemplary single-substrate reaction chamber.

Treatments are described herein for preparing germanium surfaces for subsequent deposition. The thermal reaction or plasma products preferably modify termination of the germanium surface to make it more uniformly susceptible to subsequent deposition. The treatments preferably provide a consistent density of nucleation sites across the surface. While the treatment processes are described herein in conjunction with adsorption-driven reactions of atomic layer deposition over the treated germanium surface, the skilled artisan will readily appreciate that the methods taught herein will also be applicable to nucleation of other deposition processes for a variety of materials over germanium surfaces.

Atomic layer deposition (ALD) is a self-limiting process, whereby alternated pulses of reaction precursors saturate a substrate and leave no more than one monolayer of material per pulse. The precursors are selected to ensure self-saturating reactions, because an adsorbed layer in one pulse leaves a surface termination that is non-reactive with the gas phase reactants of the same pulse. A subsequent pulse of different reactants does react with the previous termination to enable continued deposition. Thus, each cycle of alternated pulses leaves no more than about one molecular layer of the desired material. The principles of ALD type processes have been presented by T. Suntola, for example in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosures of which are incorporated herein by reference.

Unfortunately, depending upon the chemistries employed, ALD does not deposit equally well on different starting substrates. Some ALD process recipes, for example, have been found slow or even non-operative in depositing over silicon, and particularly etched or cleaned silicon surfaces (typically hydrogen-terminated). For example, it is unlikely that aluminum alkyls, such as $(CH_3)_3Al$, can attach on a hydrogen-terminated silicon surface in ALD processes for depositing $Al_2O_3$.

Germanium has been found similarly inhospitable to ALD reactions. Cleaned germanium surfaces provide poor adsorption sites for typical ALD reactants under typical ALD conditions, which include temperatures low enough to avoid thermal decomposition of the reactants and high enough to avoid condensation. Germanium does not readily oxidize, moreover, such that its native oxide is of a particularly poor quality and consistency. The spotty and unstable oxide results in very slow and rough deposition by many CVD and ALD process recipes.

Intermediate layers are often deposited prior to deposition of the desired functional layer for a variety of remedial reasons, including otherwise poor adhesion, nucleation, electrical interface properties, diffusion, etc. Such intermediate layers add to the complexity and cost of fabrication, and can also occupy valuable space within high aspect ratio features, such as trenches in germanium substrates. For gate dielectrics, additional layers increase the overall dielectric thickness and reduce the effectiveness of the layer, contrary to the trend for scaling down integrated circuits.

Surface preparation can be conducted by wet bench treatments. See, for example, Bai et al., "Ge MOS Characteristics with CVD HfO$_2$ Gate Dielectrics and TaN Gate Electrode," 2003 Symp. on VLSI Tech. Digest of Tech. Papers (June 2003). However, such wet chemical treatments are prone to impurity issues, both in the treatment baths and in transit from such baths to deposition tools. Accordingly, the preferred processes described herein employ vapor processes, and particularly in situ processing within the tool in which deposition over germanium surfaces is to be conducted.

Preferred Reactor

Prior to describing the processes in greater detail, an exemplary reactor for surface treatments and vapor deposition processes is first described below. While not illustrated separately, the surface treatment and ALD processes described below can be performed in a Pulsar™ 3000 reactor, commercially available from ASM America, Inc. of Phoenix, Ariz., for certain embodiments with a remote plasma processing unit connected thereto.

The preferred embodiments are presented in the context of a single-substrate, horizontal flow cold-wall reactor. The illustrated single-pass horizontal flow design enables laminar flow of reactant gases, with low residence times, which in turn facilitates sequential processing while minimizing reactant interaction with each other and with chamber surfaces. Thus, among other advantages, such a laminar flow enables sequentially flowing reactants that might react with each other. Reactions to be avoided include highly exothermic or explosive reactions, such as produced by oxygen and hydrogen-bearing reactants, and reactions that produce particulate contamination of the chamber.

The skilled artisan will recognize, however, that other reactor designs can also be provided for achieving these ends. For example, the processes described herein need not be performed in situ within a single chamber. If the surface treatments are performed in a different chamber from the depositions, the chambers are preferably clustered together around a high purity transfer chamber. Moreover, the processes described herein can be readily implemented in batch processing tools, single wafer tools that employ showerhead arrangements, and the like.

FIG. 1 shows the exemplary vapor deposition reactor 10, including a quartz process or reaction chamber 12, constructed in accordance with a preferred embodiment, and for which the methods disclosed herein have particular utility. While originally designed to optimize epitaxial deposition of silicon on a single substrate at a time, the inventors have found the superior processing control to have utility in of a number of different processes. Moreover, the illustrated reactor 10 can safely and cleanly accomplish multiple treatment steps sequentially in the same chamber 12. The basic configuration of the reactor 10 is available commercially under the trade name Epsilon® from ASM America, Inc. of Phoenix, Ariz.

A plurality of radiant heat sources are supported outside the chamber 12 to provide heat energy in the chamber 12 without appreciable absorption by the quartz chamber 12 walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates (not shown) above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

A substrate, preferably comprising a silicon wafer 16, is shown supported within the reaction chamber 12 upon a substrate support structure 18. Note that, while the substrate of the illustrated embodiment is a single-crystal silicon wafer, it will be understood that the term "substrate" broadly refers to any surface on which a layer is to be deposited. Moreover, the principles and advantages described herein apply equally well to depositing layers over numerous other types of substrates, including, without limitation, glass substrates such as those employed in flat panel displays.

The illustrated support structure 18 includes a substrate holder 20, upon which the wafer 16 rests, and a support spider 22. The spider 22 is mounted to a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12.

A plurality of temperature sensors are positioned in proximity to the wafer 16. The temperature sensors may take any of a variety of forms, such as optical pyrometers or thermocouples. The number and positions of the temperature sensors are selected to promote temperature uniformity, as will be understood in light of the description below of the preferred temperature controller. Preferably, however, the temperature sensors directly or indirectly sense the temperature of positions in proximity to the wafer.

In the illustrated embodiment, the temperature sensors comprise thermocouples, including a first or central thermocouple 28, suspended below the wafer holder 20 in any suitable fashion. The illustrated central thermocouple 28 passes through the spider 22 in proximity to the wafer holder 20. The reactor 10 further includes a plurality of secondary or peripheral thermocouples, also in proximity to the wafer 16, including a leading edge or front thermocouple 29, a trailing edge or rear thermocouple 30, and one or more side thermocouples (not shown). Each of the peripheral thermocouples are housed within a slip ring 32, which surrounds the substrate holder 20 and the wafer 16. Each of the central and peripheral thermocouples are connected to a PID temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. By minimizing edge losses, the slip ring 32 can reduce the risk of radial temperature non-uniformities across the wafer 16. The slip ring 32 can be suspended by any suitable means. For example, the illustrated slip ring 32 rests upon elbows 34 which depend from a front chamber divider 36 and a rear chamber divider 38. The dividers 36, 38 desirably are formed of quartz. In some arrangements, the rear divider 38 can be omitted.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and the outlet 42.

An inlet component 50 is fitted to the reaction chamber 12, adapted to surround the inlet port 40, and includes a horizontally elongated slot 52 through which the wafer 16 can be inserted. A generally vertical inlet 54 receives gases from remote sources, as will be described more fully with respect to FIG. 2, and communicates such gases with the slot 52 and the inlet port 40. The inlet 54 can include gas injectors as described in U.S. Pat. No. 5,221,556 (issued 22 Jun. 1993), or as described with respect to FIGS. 21-26 in U.S. Pat. No. 6,093,252 (issued 25 Jul. 2000), the disclosures of which are hereby incorporated by reference. Such injectors are designed to maximize uniformity of gas flow for the single-wafer reactor.

An outlet component 56 similarly mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the reaction chamber 12 and a downstream scrubber (not shown). A pump or fan is preferably included to aid in drawing process gases through the chamber 12, and to evacuate the chamber for low pressure processing.

The preferred reactor 10 also includes a source 60 of excited species, preferably positioned upstream from the chamber 10. The excited species source 60 of the illustrated embodiment comprises a remote plasma generator, including a magnetron power generator and an applicator along a gas line 62. An exemplary remote plasma generator is available commercially under the trade name TRW-850 from Rapid Reactive Radicals Technology (R3T) GmbH of Munich, Germany. In the illustrated embodiment, microwave energy from a magnetron is coupled to a flowing gas in an applicator along a gas line 62. A source of precursor gases 63 is coupled to the gas line 62 for introduction into the excited species generator 60. A source of carrier gas 64 is also coupled to the gas line 62. One or more further branch lines 65 can also be provided for additional reactants. As is known in the art, the gas sources 63, 64 can comprise gas tanks, bubblers, and the like, depending upon the form and volatility of the reactant species. Each gas line can be provided with a separate mass flow controller (MFC) and valves, as shown, to allow selection of relative amounts of carrier and reactant species introduced to the excited species generator 60 and thence into the reaction chamber 12.

It will be understood that, in other arrangements, the excited species can be generated within the process chamber. For example, in situ plasmas can be generated by applying radio frequency (RF) power to spaced electrodes within the process chamber, as is known in the art. Exemplary in situ plasma CVD reactors are available, for example, from ASM Japan K.K. of Tokyo, Japan under the trade name Eagle™ 10 or Eagle™ 12. Furthermore, energy can be coupled to source gases by a number of means, including by induction, capacitively, etc., for either in situ or remote plasma generation. Preferably, however, a remote plasma source is employed for the processes described herein, affording greater control for surface modification with minimal bulk effects.

Wafers are preferably passed from a handling chamber (not shown), which is isolated from the surrounding environment, through the slot 52 by a pick-up device. The handling chamber and the processing chamber 12 are preferably separated by a gate valve (not shown) of the type disclosed in U.S. Pat. No. 4,828,224 (issued 9 May 1989), the disclosure of which is hereby incorporated herein by reference.

The total volume capacity of a single-wafer process chamber 12 designed for processing 200 mm wafers, for example, is preferably less than about 30 liters, more preferably less than about 20 liters, and most preferably less than about 10 liters. The illustrated chamber 12 has a capacity of about 7.5 liters. Because the illustrated chamber 12 is divided by the dividers 32, 38, wafer holder 20, ring 32, and the purge gas flowing from the tube 26, however, the effective volume through which process gases flow is around half the total volume (about 3.77 liters in the illustrated embodiment). Of course, it will be understood that the volume of the single-wafer process chamber 12 can be different, depending upon the size of the wafers for which the chamber 12 is designed to accommodate. For example, a single-wafer processing chamber 12 of the illustrated type, but for 300 mm wafers, preferably has a capacity of less than about 100 liters, more preferably less than about 60 liters, and most preferably less than about 30 liters. One 300-mm wafer processing chamber has a total volume of about 24 liters, with an effective processing gas capacity of about 11.83 liters.

Figure 2:
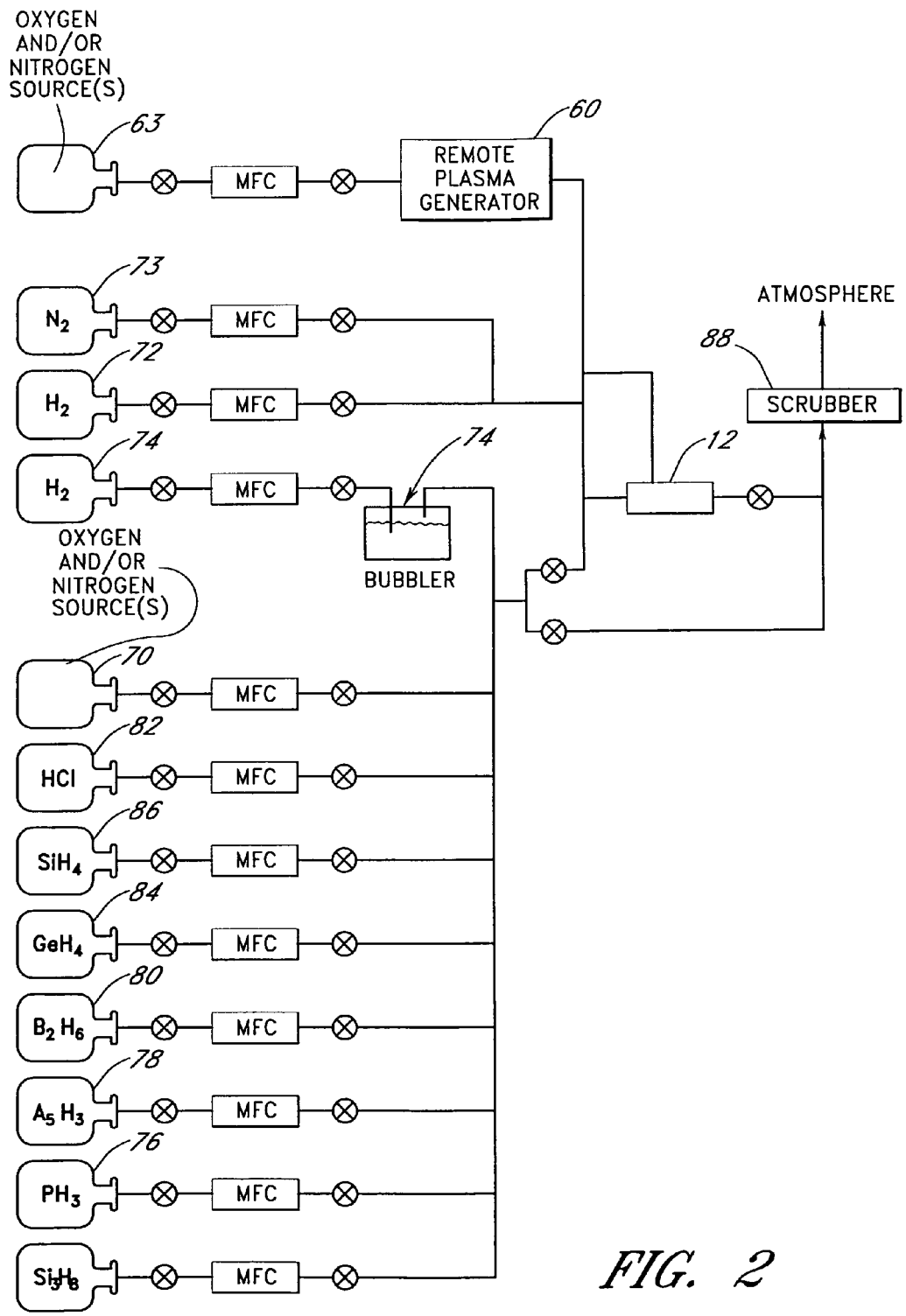
FIG. 2 is a gas flow schematic, illustrating reactant and purge gas sources in accordance with a preferred embodiment of the present invention.

FIG. 2 shows a gas line schematic, in accordance with the preferred embodiment. The reactor 10 is provided with a thermal reactant source 70 of oxygen and/or nitrogen. The thermal reactant source 70 can comprise any of a number of known oxygen- and/or nitrogen-containing chemicals, particularly a volatile chemical such as $O_2$, $O_3$, $H_2O$, $H_2O_2$, NO, $NO_2O$, $N_2$, $N_2/H_2$, HCOOH, $HClO_3$, $CO_2$, mixtures of the foregoing, etc. Preferably, the reactant is introduced in an inert carrier gas flow, such as $N_2$ or noble gas, although pure reactant flows can also be used. Alternatively or in addition, an oxygen-containing and/or nitrogen gas source 63 can be connected to the remote plasma generator 60 to provide excited species for surface treatment.

As also shown in FIG. 2, the reactor 10 further includes a source 72 of hydrogen gas ($H_2$). As is known in the art, hydrogen is a useful carrier gas and purge gas because it can be provided in very high purity, due to its low boiling point, and is compatible with silicon deposition. $H_2$ can also be employed in a high temperature hydrogen bake to sublimate native oxide prior to layer formation. $H_2$ can also flow through the excited species generator 60 to generate H radicals for native oxide cleaning or for other purposes.

The preferred reactor 10 also includes a source 73 of nitrogen gas ($N_2$). As is known in the art, $N_2$ is often employed in place of $H_2$ as a carrier or purge gas in semiconductor fabrication. Nitrogen gas is relatively inert and compatible with many integrated materials and process flows. Other possible carrier gases include noble gases, such as helium (He) or argon (Ar).

A liquid reactant source 74 is also shown. The bubbler can hold liquid organometallic precursors, such as $Ta(OC_2H_5)_5$, while a gas line serves to bubble $H_2$, $N_2$, Ne, He or Ar through the liquid metal source and transport metallorganic precursors to the reaction chamber 12 in gaseous form.

When semiconductor deposition (for example, Si, Ge, SiGe) is also performed in the same chamber, the liquid source 74 can comprise, for example, liquid dichlorosilane (DCS), trichlorosilane (TCS), trisilane or other high order silane sources in a bubbler. In such cases, or when gaseous semiconductor sources such as the illustrated silane source 86 or trisilane source are used, the reactor 10 can also include other source gases such as dopant sources (for example, the illustrated phosphine 76, arsine 78 and diborane 80 sources) and etchants for cleaning the reactor walls and other internal components (for example, HCl source 82 or $NF_3/Cl_2$ provided as the plasma source gas 63 for feeding the excited species generator 60). For deposition of germanium-containing materials (for example, the germanium base layer or SiGe layers), a source of germanium 84 (for example, germane or $GeH_4$ as shown) can also be provided.

Each of the gas sources may be connected to the inlet 54 (FIG. 1) via gas lines with attendant safety and control valves, as well as mass flow controllers (MFCs), which are coordinated at a gas panel. Process gases are communicated to the inlet 54 (FIG. 1) in accordance with directions programmed into a central controller and distributed into the process chamber 12 through injectors. After passing through the process chamber 12, unreacted process gases and gaseous reaction by-products are exhausted to a scrubber 88 to condense environmentally dangerous fumes before exhausting to the atmosphere.

In addition to the conventional gas sources and liquid bubblers, discussed above, the preferred reactor 10 includes the excited species source 60 positioned remotely or upstream of the reaction chamber 12. The illustrated source 60 couples microwave energy to gas flowing in an applicator, where the gas includes reactant precursors from the reactant source 63. For the processes described below, the plasma source gases 63 include a source of oxygen and/or a source of nitrogen. Other useful plasma source gases for the preferred processes include $N_2$, and noble gases as plasma-supporting carrier gases. A plasma is ignited within the applicator, and excited species are carried toward the chamber 12. Preferably, of the excited species generated by the source 60, overly reactive ionic species substantially recombine prior to entry into the chamber 12. On the other hand, radicals such as N or O survive to enter the chamber 12 and react as appropriate. As will be clear from the general process discussion below, remote plasma-generated excited species facilitate high quality layers as well as possible greater wafer throughput.

Process Flow

Figure 3:
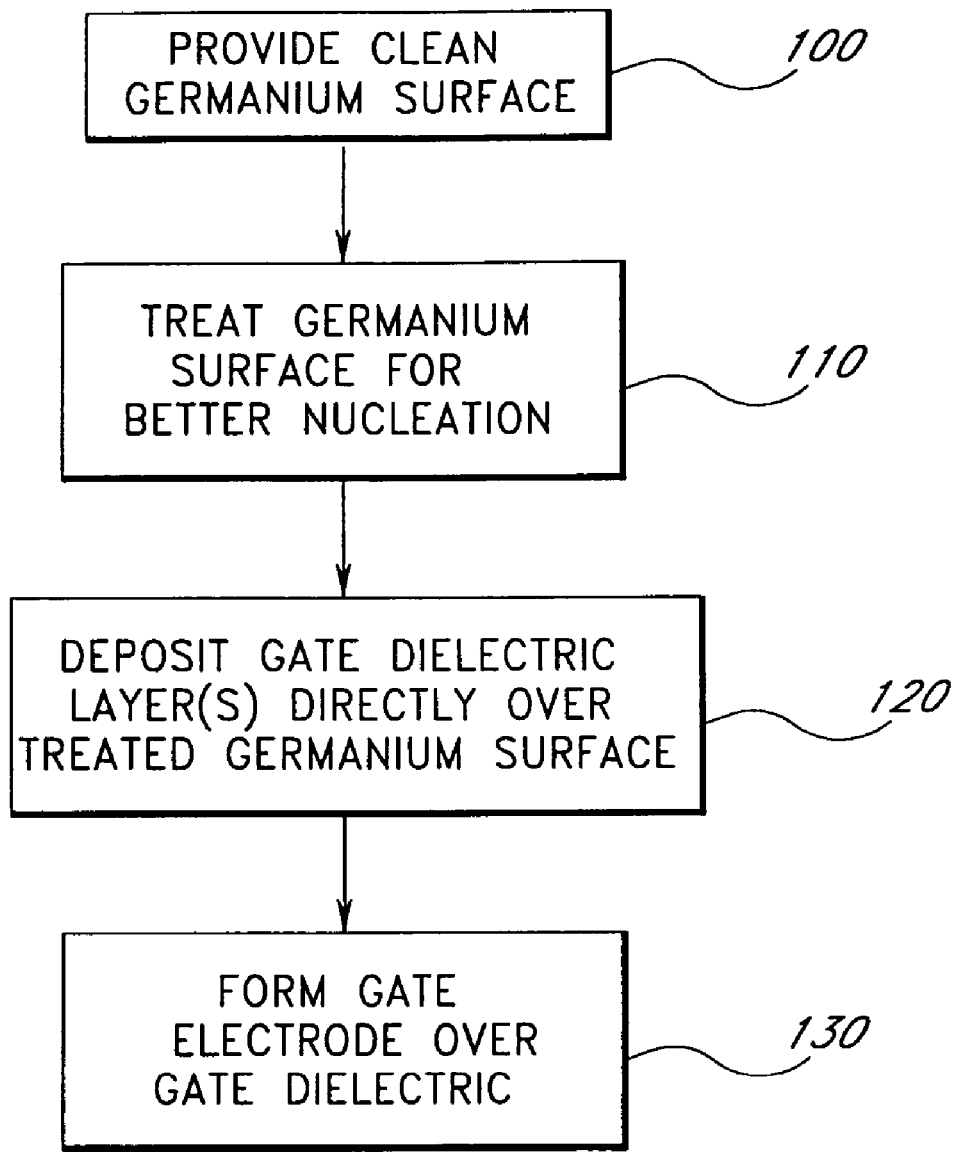
FIG. 3 is a flow chart generally showing steps for treating substrates in accordance with the preferred embodiments.

FIG. 3 shows a general process sequence in accordance with the invention, illustrated in the context of forming a transistor gate stack on a germanium surface. Initially a germanium surface is provided 100. The germanium surface can comprise, among other things, an epitaxial germanium layer, a high [Ge] germanium alloy (for example, SiGe with [Ge] >20 atomic %, particularly for alloys with >40 atomic %) or the top surface of a monolithic germanium wafer. The embodiments described herein are particularly useful for substantially pure (preferably greater than 90% and more preferably greater than 95% pure) germanium surfaces.

Prior to the pretreatment process 110, the germanium layer can be optionally first cleaned to remove contaminants and naturally occurring or native oxide. Conventionally, wafer cleaning prior to gate oxide growth is conducted ex situ prior to loading the wafer into the process chamber. For example, wafers may be cleaned in an SC1/HF wet etch bath. Alternatively, an integrated HF and acetic acid vapor clean can be conducted in a neighboring module within a cluster tool, reducing transport time and opportunity for recontamination or reoxidation. For some applications, the cleaning oxide left by the SC1 step is not removed, but is instead used as the initial oxide layer. In another possibility, a hydrogen bake step can be conducted within the deposition chamber to sublimate native oxide. Small amounts of HCl vapor can be added to this step to aid in cleaning metal contaminants and the like during the hydrogen bake. In still another arrangement, plasma products can assist or conduct in situ cleaning, such as by substituting H radicals for hydrogen gas. Due to the low melting point of germanium, however, if cleaning is employed then preferably an ex situ wet clean is employed.

The wafer or other substrate supporting the germanium surface is loaded into the process chamber. Even after cleaning, germanium surfaces tend to include inconsistent and undesirable surface characteristics, including poor quality and non-uniform native oxide. Such surfaces can render subsequent ALD processes, such as the illustrated ALD deposition of $ZrO_2$ or $Al_2O_3$, inconsistent in their nucleation, and also cause incorporation of impurities into the structure. GeO and $GeO_2$ are highly unstable on germanium surfaces. One method of facilitating consistent nucleation of the subsequent deposition (for example, adsorption of ALD reactants) is to deposit a thin interfacial layer. Disadvantageously, however, such a layer increases the overall thickness of the dielectric to be formed upon the substrate and also tends to decrease the effective dielectric constant.

Accordingly, the preferred embodiments employ a surface treatment 110 of the germanium surface, preferably conducted in the same chamber as a subsequent deposition 120 of the gate dielectric. The treatment modifies the surface termination of the substrate to promote subsequent deposition. Advantageously, the treatment 110 is tuned such that the reactants and conditions impart sufficient energy to break the surface bonds (for example, Ge—Ge bonds) and form new ones, while temperature is maintained low enough to prevent etching of the substrate or significant diffusion of active species into the bulk material. Additionally, no appreciable deposition takes place. Preferably no more than a monolayer of terminating tails or bridges is left by the surface treatment 110. As discussed below, while no deposition beyond surface termination takes place, some conversion (for example, oxidation, nitridation) of the top few monolayers of the substrate can be advantageous.

In general, the germanium surface treatment has a minimal effect on the bulk germanium below the surface. Preferably, the treatment takes place at less than about 700° C., and more preferably less than about 650° C. Bulk effects to be avoided include deep diffusion of reactants, such as oxygen and nitrogen, into the bulk. Particularly, formation of GeO and $GeO_2$ in the bulk is to be avoided. These compounds, unlike silicon dioxide, are very unstable and in fact GeO is water-soluble. Nitrogen formation in the bulk is less of an issue. Nevertheless, oxidation and nitridation should penetrate less than about 15 Å below the original surface of the germanium, more preferably less than about 10 Å, most preferably from 2-5 Å. Limiting bulk diffusion avoids detrimental effects on the Ge electrically active layer and to inhibits increasing the dielectric constant or thickening of the equivalent oxide thickness (EOT). Process parameters are thus set to avoid significant oxygen and/or nitrogen diffusion into the bulk, beyond the oxygen and/or nitrogen incorporation in the upper few monolayers of the substrate. Preferably, the bulk germanium (for example, at a depth of 30 Å or greater) contains less than about 1% atomic concentration of nitrogen and less than about 1% atomic concentration of oxygen. At a depth of 10 Å or greater from the original germanium surface, each of oxygen concentration and nitrogen concentration is preferably less than about 10 atomic %. Preferably, the treatment 110 leaves a surface termination of oxygen bridges, nitrogen bridges, —NH surface groups, —$NH_2$ surface groups, —OH surface groups, or mixtures of the foregoing.

In accordance with one embodiment, the treatment comprises a plasma treatment. Preferably, the plasma is generated by a remote plasma, such that highly energetic ions do not bombard and damage the germanium surface. Reactants include oxygen and/or nitrogen excited species that are remotely generated and therefore optimized for neutral excited species generation, particularly N and O. Exemplary sources for the nitrogen and oxygen excited species include, but are not limited to, $NH_3$, $O_2$, $O_3$, $H_2O$, $H_2N_2$, $H_2/N_2$, $N_2O$, NO, $N_2$, carbon-containing reactants such as $CO_2$, and organic compounds such as acetic acid. Mixtures of the above compounds are also contemplated, particularly mixtures of any of the above compounds with oxygen and with hydrogen. Nitrogen, argon, helium, neon, krypton or other inert gas can also flow to aid formation of glow discharge and serve as carrier gas, but the total flow rates and partial pressures are preferably arranged to keep reaction chamber pressure below about 10 Torr for maintaining operation of the remote plasma unit. Preferably, the process parameters are tuned to be sufficient for breaking surface bonds without significant bulk modification. In the illustrated embodiments, wherein subsequent deposition 120 is conducted in situ by ALD, temperatures are preferably in the range of room temperature to 700° C., more preferably from 200° C. to 500° C. For the given temperature, pressure, remote plasma power, reaction times and reactant concentrations are adjusted to achieve the desired surface conditioning.

Preferably, conditions are arranged such that the above-referenced diffusion preferences are maintained, while at the same time ensuring full reaction of the germanium surface to leave oxygen bridges, nitrogen bridges, —NH surface groups, —$NH_2$ surface groups, —OH surface groups, or mixtures of the foregoing. Accordingly, the substrate can be maintained anywhere from room temperature up to 700° C. Preferably, a temperature of the substrate is kept below about 500° C., and more preferably below 300° C., to minimize risk of diffusion. An exemplary power level for a remote plasma generator is in the range of 500 W to 2 kW.

In another embodiment, the germanium surface treatment 110 comprises a thermal treatment to achieve the same goals of oxygen bridges, nitrogen bridges, —NH surface groups, —$NH_2$ surface groups, —OH surface groups, or mixtures of the foregoing with minimal oxidation or nitridation into the bulk. Accordingly, the same list of reactants noted above for the remote plasma reactions can be employed for thermal reactions, as long as sufficient energy is provided to form the desired surface termination. Again, depending on reactivity of the reactants, thermal reactions can take place from room temperature to 700° C., although temperatures are preferably kept below about 500° C. and more preferably below about 300° C. to avoid diffusion into the bulk.

The germanium surface treatment 110 is most preferably conducted in situ in the same chamber as a subsequent dielectric deposition 120. In this case, the substrate temperature is preferably set to match that desired for the subsequent deposition 120 within the same chamber. Surface treatment 110 and deposition 120 can be considered isothermal, within the meaning of the present description, if the processes are conducted within about 50° C. of one another, more preferably within about 25° C. of one another, and most preferably the target or set point temperatures are identical so that no temperature ramping is required between steps.

As noted, the process does not result in a deposited layer. Process parameters are preferably selected to replace Ge—Ge bonds in the upper few monolayers of the substrate with Ge—O bonds, Ge—N bonds —OH surface groups and/or —NH surface groups, particularly converting less than about 15 Å of the substrate surface to germanium oxide, germanium nitride or germanium oxynitride. More preferably, the surface treatment forms less than about 10 Å and most preferably about 2 Å to 5 Å on average.

Following the germanium surface treatment 110, the gate dielectric is deposited 120 over the treated surface. The deposition 120 can also include excited species flow; however, in such a case, the radical supply from the prior germanium surface treatment 110 will typically be different from the supply employed in the deposition 120. Furthermore, for the preferred ALD processes, the reaction chamber should be emptied (for example, purged) of any reactants prior to each reactant pulse. Accordingly, the flow of stable gases or excited species during the germanium surface treatment 110 is preferably stopped prior to deposition 120.

In accordance with the preferred embodiment, the deposition 120 comprises an ALD-type deposition, wherein alternated pulses saturate the surface, and each cycle leaves no more than about 1 monolayer of the dielectric material. In the examples below, an aluminum source gas or zirconium source gas is alternated with an oxygen source gas to form aluminum oxide ($Al_2O_3$) and zirconium oxide ($ZrO_2$). The skilled artisan will appreciate that similar recipes can be employed to form other high k materials, such as hafnium oxide ($HfO_2$), tantalum oxide ($Ta_2O_5$), barium strontium titanate (BST) or strontium bismuth tantalate (SBT).

The first pulse of the ALD deposition advantageously reacts with the termination left by the germanium surface treatment 110. Alternatively, a further surface treatment can be provided prior to the deposition. For example, a water treatment can more readily react with the surface after the germanium surface treatment 110, to leave a hydroxyl-terminated surface that readily react with subsequent ALD processes.

In one embodiment, either before or after the germanium surface treatment 110, the substrate supporting the germanium surface is loaded into the reaction space of a Pulsar™ 3000 reactor (commercially available from ASM America, Inc. of Phoenix, Ariz.), which is designed for ALD processes. The reaction space is evacuated to vacuum with a mechanical vacuum pump. After evacuation the pressure of the reaction space is adjusted to about 5 to 10 mbar (absolute) with flowing inert gas (for example, helium, argon or nitrogen gas) that had a purity of 99.9999%. Then the reaction space is stabilized at 300° C. Alternating vapor phase pulses of $(CH_3)_3Al$ and $H_2O$, vaporized from external sources, are introduced into the reaction space and contacted with the substrate surface. The source chemical pulses are separated from each other with flowing nitrogen or other inert gas.

Each pulsing cycle consists of four basic steps:
$(CH_3)_3Al$ pulse
$N_2$ purge
$H_2O$ pulse
$N_2$ purge An exemplary aluminum oxide deposition cycle is summarized in Table I.

TABLE I $Al_2O_3$

| Phase | Reactant | Temperature (° C.) | Pressure (mbar) | Time (sec) |
|---|---|---|---|---|
| pulse 1 | TMA | 300 | 5 to 10 | 0.2 |
| purge 1 | — | 300 | 5 to 10 | 1.1 |
| pulse 2 | $H_2O$ | 300 | 5 to 10 | 1.5 |
| purge 2 | — | 300 | 5 to 10 | 3.0 |

The number of cycles determines the thickness of the layer. The growth rate of $Al_2O_3$ from $(CH_3)_3Al$ and $H_2O$ is typically near 0.1 nm/cycle or 1 Å/cycle at 300° C., or about 3 to 4 cycles/monolayer ($Al_2O_3$ has a bulk lattice parameter of about 3 Å). The methyl terminations left by each TMA pulse reduce the number of available chemisorption sites, such that less than a full monolayer forms with each pulse. The pulsing cycle is repeated sufficient times to produce the desired layer thickness. Aluminum oxide can be used as the gate dielectric, or as a thin layer prior to forming another dielectric layer.

In another arrangement, $ZrO_2$ is deposited by an ALD type process. $ZrCl_4$ vapor is introduced to the reaction chamber and exposed the wafer surface for 1.5 s. This is referred to as pulse A. The reaction chamber was purged with nitrogen gas for 3.0 s to remove surplus $ZrCl_4$ and byproducts from the reaction chamber. This is referred to as purge A. Then water vapor was introduced to the reaction chamber and exposed to the wafer surface for 3.0 s. This is referred to as pulse B. Residual $H_2O$ and reaction byproducts were removed by purging the reaction chamber for 4.0 s. This is referred to as purge B. During each of the reaction phases, the reactants are supplied in sufficient quantity for the given other parameters to saturate the surface.

This exemplary high k deposition cycle is summarized in Table II.

TABLE II $ZrO_2$

| Phase | Reactant | Temperature (° C.) | Pressure (mbar) | Time (sec) |
|---|---|---|---|---|
| pulse A | $ZrCl_4$ | 300 | 5 to 10 | 1.5 |
| purge A | — | 300 | 5 to 10 | 3.0 |
| pulse B | $H_2O$ | 300 | 5 to 10 | 3.0 |
| purge B | — | 300 | 5 to 10 | 4.0 |

The cycle of Table II, consisting of pulse A, purge A, pulse B, purge B, was repeated 51 times. The average deposition rate is about 0.59 Å/cycle at 300° C., such that the $ZrO_2$ thickness was about 30 Å.

More generally, temperatures during an ALD process preferably fall between about 200° C. and 500° C., depending upon the acceptable level of chlorine incorporation into the layer. At higher temperatures, the chlorine content goes down. Too much chlorine can lead to charge trapping. At 300° C. chlorine content has been measured at about 0.5%. For an amorphous $ZrO_2$ layer, the temperature is more preferably at the low end of this range, between about 200° C. and 250° C., and most preferably at about 225° C. For a crystalline film, the temperature is more preferably at the high end of this range, between about 250° C. and 500° C., and most preferably about 300° C. As will be appreciated by the skilled artisan, however, mixtures of amorphous and crystalline composition result at the boundary of these two regimes. The illustrated process produces a largely crystalline $ZrO_2$ film.

In this case, the metal monolayer formed in the metal phase is self-terminated with chloride, which does not readily react with excess $ZrCl_4$ under the preferred conditions. The preferred oxygen source gas, however, reacts with or adsorbs upon the chloride-terminated surface during the oxygen phase in a ligand-exchange reaction limited by the supply of zirconium chloride complexes previously adsorbed. Moreover, oxidation leaves a hydroxyl and oxygen bridge termination that does not further react with excess oxidant in the saturative phase.

Preferably, sufficient cycles are conducted to grow between about 20 Å and 60 Å of $ZrO_2$. More preferably, sufficient cycles are conducted to grow between about 20 Å and 40 Å. The dielectric constant of the layer is between about 18 and 24. In the illustrated examples, 30 Å of $Zr_2O_3$ was formed.

Gate dielectric deposition 120 may include multiple deposition steps. However, due to the prior surface treatment, the need for an interface layer is reduced, such that a high k material (having a k value greater than that of silicon nitride, more preferably greater than 10) is preferably directly deposited upon the treated germanium surface. Multiple "nanolaminate" sublayers can still have an advantage in tailoring crystal structure and/or maximizing dielectric constant without sacrificing barrier properties.

Following gate dielectric formation, the gate electrode is deposited 130 over the gate dielectric. Once the gate stack has been completed, the gate electrodes are preferably patterned by conventional photolithographic techniques and etching. In other arrangements, the gate electrodes can be patterned prior to or after deposition of an overlying metal layer, and the metal can be employed in a self-aligned silicidation, as is known in the art. In some arrangements, the gate electrode itself comprises a metal with a work function tailored to the underlying germanium.

Having completed the gate stack, further processing to complete the integrated circuit follows. For example, gate stacks typically are insulated by blanket deposition of a dielectric and spacer etch. Transistor active areas are then doped to form source and drain regions to either side of the patterned electrodes, and wiring or "back end" processes complete the circuit.

Advantageously, the germanium surface treatment 110 facilitates subsequent deposition over the treated germanium surface. In the illustrated example, the germanium surface treatment 110 facilitates adsorption of ALD reactants.

Figure 4A:
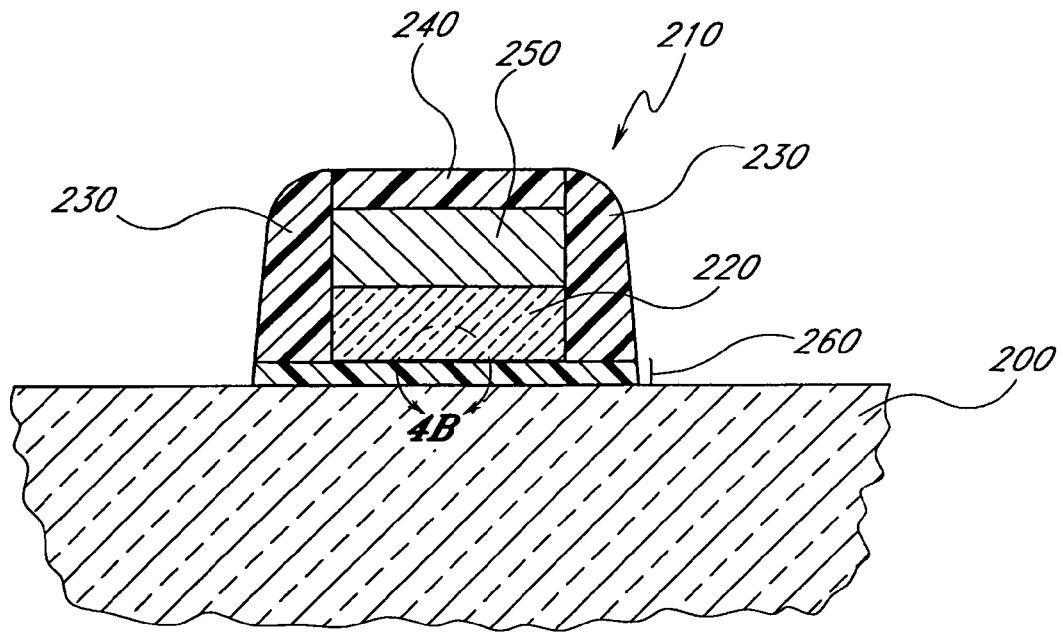
FIGS. 4A and 4B are schematic sections of a transistor gate stack constructed in accordance with preferred embodiments of the invention.
Figure 4B:
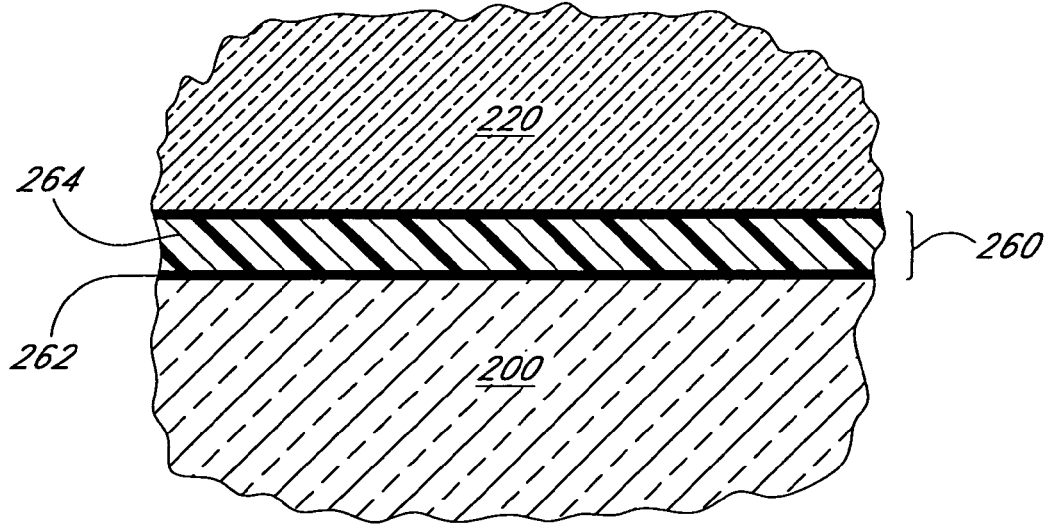

FIGS. 4A and 4B illustrate a transistor gate incorporating such a dielectric stack. In particular, a germanium structure 200 is shown with a transistor gate stack 210 formed over the germanium structure. In the illustrated embodiment, the germanium structure 200 comprises an upper portion of a single-crystal germanium wafer, though the skilled artisan will appreciate that the substrate can also comprise epitaxially deposited germanium or SiGe with a high [Ge].

The gate stack 210 includes an electrode layer 220, with sidewall spacers 230 and an insulating layer 240 protecting and isolating the electrode 220 in a conventional manner. Also illustrated is a more highly conductive strapping layer 250, typically including metal, over the gate electrode 220. The strap 250 facilitates rapid signal propagation among transistor gates across the wafer, connecting the gates to logic circuits. The gate electrode may comprise a conventional doped polysilicon layer, SiGe alloy, or metal alloy with compositions tailored for a desired work function.

A gate dielectric 260, formed by the exemplary processes described above, separates the gate electrode 220 from the germanium structure 200. As noted in the Background section above, the gate dielectric 260 is a critical feature in the pursuit of denser and faster circuits.

As best seen from the enlarged view of FIG. 4B, the preferred gate dielectric 260 includes an interface 262 with the underlying germanium structure 200 and a bulk dielectric layer 264. The interface 262 of the illustrated embodiment does not represent a deposited layer; rather, the interface has been modified by very slight oxidation, nitridation and/or surface group formation prior to the deposition of the bulk dielectric layer 264 thereover. In other arrangements, the germanium surface treatments could leave additional layers. In the illustrated embodiments, excited species from a remote plasma or thermal reactions form the interface 262 immediately prior to ALD, where surface modification facilitates adsorption of ALD reactants. In the case of remote plasma nitridation and/or oxidation, the interface 262 comprises a nitridized and/or oxidized portion of the germanium structure 200 preferably extending less than about 15 Å, more preferably less than about 10 Å into the germanium structure 200, most preferably comprising about 2 Å to 5 Å. Preferably the bulk germanium underneath this interface 262 contains less than about 10 atomic % nitrogen and less than about 10 atomic % oxygen at a depth of 10 Å or greater depth.

Due to the consistent nucleation (adsorption) offered by the germanium surface treatment, in combination with the inherently self-limiting nature of ALD, the dielectric layer 260 can be made extremely thin and yet still exhibit excellent smoothness. The poor surface quality natural to germanium, and consequently inconsistent deposition on top of the germanium, is thus overcome. Preferably, the high k layer 260 has a thickness of less than about 100 Å, more preferably less than about 50 Å, and a surface roughness of less than about 5 Å rms, more preferably less than about 3 Å rms, and with the truly self-limiting surface reactions of ALD, even surface roughness of less than 1.5 Å is possible.

It will be appreciated by those skilled in the art that various omissions, additions and modifications may be made to the processes described above without departing from the scope of the invention, and all such modifications and changes are intended to fall within the scope of the invention, as defined by the appended claims. For example, while illustrated in the context of surface treatment prior to ALD and CVD, the skilled artisan may also find application for treatment of germanium surfaces prior to other forms of deposition, including but not limited to MOCVD and JVD.

I claim:

1. An integrated circuit, comprising:
    a semiconductor structure with greater than about 40 atomic % germanium;
    a gate dielectric layer over the semiconductor structure, the layer having a thickness of no more than about 50 Å and a surface roughness no more than about 3 Å rms; and nitrogen and/or oxygen at an interface between the semiconductor structure and the gate dielectric, wherein the semiconductor structure has less than about 10 atomic % oxygen at a depth of greater than about 10 Å from an upper surface of the semiconductor structure.

2. The integrated circuit of claim 1, wherein the gate dielectric comprises a material selected from the group consisting of aluminum oxide, zirconium oxide, hafnium oxide, tantalum oxide, barium strontium titanate and strontium bismuth tantalate.

3. The integrated circuit of claim 2, wherein the gate dielectric comprises zirconium oxide.

4. The integrated circuit of claim 1, comprising between about 2 Å and about 5 Å of germanium nitride at the interface.

5. The integrated circuit of claim 1, comprising between about 2 Å and about 5 Å of germanium oxide at the interface.

6. The integrated circuit of claim 1, comprising between about 2 Å and about 5 Å of germanium oxynitride at the interface.

7. The integrated circuit of claim 1, wherein the semiconductor structure has less than about 10 atomic % nitrogen at a depth of greater than about 10 Å from the upper surface of the semiconductor structure.

8. The integrated circuit of claim 7, wherein the semiconductor structure has less than about 1 atomic % oxygen and less than about 1 atomic % nitrogen at a depth of equal to or greater than about 30 Å from the upper surface of the semiconductor structure.

9. The integrated circuit of claim 1, wherein the semiconductor structure has greater than about 90 atomic % germanium.

10. The integrated circuit of claim 1, wherein the gate dielectric has a dielectric constant greater than about 5.

11. The integrated circuit of claim 1, wherein the gate dielectric has a dielectric constant greater than about 10.

12. An apparatus comprising:
a single-crystal germanium-containing substrate;
a gate dielectric layer positioned over the germanium-containing substrate; and
a germanium-containing interface layer having a different material composition from the germanium-containing substrate, wherein the interface layer
  (a) is comprised of germanium oxide, germanium nitride or germanium oxynitride,
  (b) is positioned between the germanium-containing substrate and the gate dielectric layer, and
  (c) has a thickness less than about 15 Å, and
the single-crystal germanium-containing substrate has less than about 10 atomic % nitrogen and less than about 10 atomic % oxygen at a depth of greater than about 10 Å from an upper surface of the single-crystal germanium containing substrate.

13. The apparatus of claim 12, wherein the germanium-containing substrate contains greater than about 20 atomic % germanium.

14. The apparatus of claim 12, wherein the germanium-containing substrate contains greater than about 40 atomic % germanium.

15. The apparatus of claim 12, wherein the germanium-containing interface layer has a thickness between about 2 Å and about 5 Å.

16. The apparatus of claim 12, wherein the gate dielectric layer has a thickness less than about 50 Å.

17. The apparatus of claim 13, wherein the gate dielectric layer has a surface roughness less than about 3 Å rms.

18. The apparatus of claim 12, wherein the gate dielectric layer comprises a material selected from the group consisting of aluminum oxide, zirconium oxide, hafnium oxide, tantalum oxide, barium strontium titanate and strontium bismuth tantalate.

* * * * *